(12) United States Patent
Ko et al.

(10) Patent No.: US 7,764,015 B2
(45) Date of Patent: Jul. 27, 2010

(54) DISPLAY DEVICE

(75) Inventors: Sam Min Ko, Incheon (KR); Sung Ho Mo, Cheongju-si (KR)

(73) Assignee: LG Electronics Inc., Seoul (KR)

(*) Notice: Subject to any disclaimer, the term of this patent is extended or adjusted under 35 U.S.C. 154(b) by 866 days.

(21) Appl. No.: 11/633,684

(22) Filed: Dec. 5, 2006

(65) Prior Publication Data
US 2007/0257612 A1 Nov. 8, 2007

(30) Foreign Application Priority Data
Apr. 25, 2006 (KR) .............. 10-2006-0037331

(51) Int. Cl.
*H01J 33/00* (2006.01)
(52) U.S. Cl. ............ 313/512; 313/506; 313/238
(58) Field of Classification Search .......... None
See application file for complete search history.

(56) References Cited

U.S. PATENT DOCUMENTS 7,255,937 B2 * 8/2007 Park ................. 428/690
7,479,735 B2 * 1/2009 Kum et al. ........... 313/512
7,572,478 B2 * 8/2009 Ogura et al. ........... 427/66
2004/0051449 A1 * 3/2004 Klausmann et al. ...... 313/512
2004/0179165 A1 9/2004 Kinoshita et al.
2006/0220549 A1 * 10/2006 Kim et al. ............. 313/512

FOREIGN PATENT DOCUMENTS

JP 2001-57474 2/2001

OTHER PUBLICATIONS

Chinese Office Action dated Sep. 5, 2008 and English language translation.

* cited by examiner

*Primary Examiner*—Ashok Patel
(74) *Attorney, Agent, or Firm*—KED & Associates, LLP

(57) ABSTRACT

The present invention relates to a display device preventing external light reflected in a region connected with plane parts disposed on a cap from transmitting to the outside, and an embodiment of the present invention may be achieved in a whole or in part by a display device comprising: a substrate; an active area disposed on the substrate; a line electrically connected to the active area, and disposed on the substrate; a cap attached to the substrate to cover the active area; and a patterned layer disposed on a transmission area disposed between the active area and a cap-attaching area to which the cap is attached.

27 Claims, 7 Drawing Sheets

_US 7,764,015 B2_

DISPLAY DEVICE

CROSS-REFERENCE TO RELATED APPLICATIONS

This application claims priority from Korean Patent Application No. 10-2006-0037331 filed on Apr. 25, 2006, the content of which is incorporated herein by reference in its entirety.

BACKGROUND

1. Field

The present invention relates to a display device. Particularly, the present invention relates to a display device preventing an external light reflected on an area connected with plane parts disposed on a cap from being transmitted to the outside of the display device.

2. Background

An organic light-emitting device, one of the display devices, is a device using organic electroluminescence. Organic electroluminescence is a phenomenon that excitons are formed in an (low molecular or high molecular) organic material thin film by re-combining holes injected through an anode with electrons injected through a cathode, and a light of specific wavelength is generated by energy of the formed excitons.

FIG. 1 is a plane view of an organic light-emitting device of the related art, and shows the organic light-emitting device to which a cap is not attached. FIG. 2 is a cross-sectional view of the organic light-emitting device taken along the line A-A of FIG. 1.

The organic light-emitting device has an active area which comprises a transparent glass substrate 1, an anode electrode disposed on the substrate 1, an organic light-emitting layer disposed on the anode electrode, a cathode electrode disposed on the organic light-emitting layer. The cap 10 is attached on the substrate 1 in order to isolate the active area 2 from the outside.

The anode electrodes and the cathode electrodes in the active area 2 are extended to the outside of the active area 2, and connected with data lines 11 and scan lines 12 respectively. Ends of the data lines 11 and the scan lines 12 are disposed on at least one edge of the substrate 1, and included in a pad part 5.

The cap 20 is attached to the substrate 1 on which the active area 2, the data lines 11 and the scan lines 12 are disposed, using a sealant 6. A cap-attaching area 4 is defined as an outer region of the active area 2, disposed on the substrate 1, to which the cap 10 is attached.

FIG. 2 shows the cap 20 comprising a first plane part 21 attached to the cap-attaching area 4, a second plane part 22 corresponding to the active area 2, and a connecting part 23 connecting the first plane part 21 with the second plane part 22.

In the organic light-emitting device having the cap, the external light is transmitted to the inside of the organic light-emitting device through a transmission area 3 disposed on the substrate 1 between the active area 2 and the cap-attaching area 4. After the external light reaches the connecting part 23 of the cap 20, the external light is reflected on a surface of the connecting part 23. And then, the reflected external light is transmitted to the outside through the transmission area 3 disposed corresponding to the connecting part 23 of the cap 20.

As explained above, because of the route of the external light reflected on the connecting part 13, the reflected external light is displayed in the shape of white light band on the outer area of the active area 2 on which images are displayed.

BRIEF DESCRIPTION OF THE DRAWINGS

The embodiments will be described in detail with reference to the following drawings in which like reference numerals refer to like elements.

DETAILED DESCRIPTION OF THE INVENTION

An object of a present invention is to prevent an external light reflected on an inner surface of a cap from being displayed on a substrate.

Another object of the present invention is to prevent an external light from being transmitted to the inner surface of the cap.

Hereinafter, the display devices according to the embodiments of the present invention will be explained in more detail with reference to the accompanying drawings. Also, organic light-emitting devices will be explained for explanation purposes. However, the present invention is not limited to the organic light-emitting devices.

Figure 1:
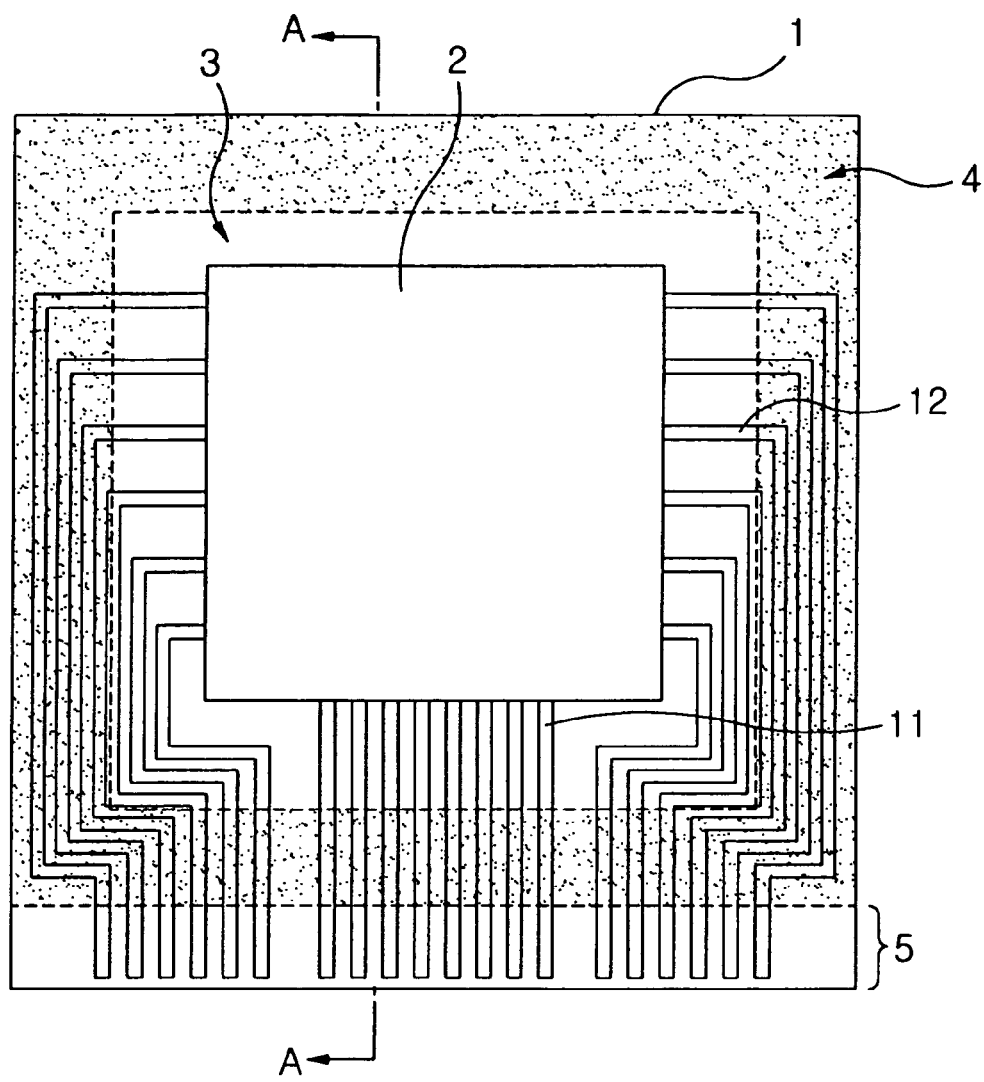
FIG. 1 is a plane view of an organic light-emitting device of the related art.
Figure 2:
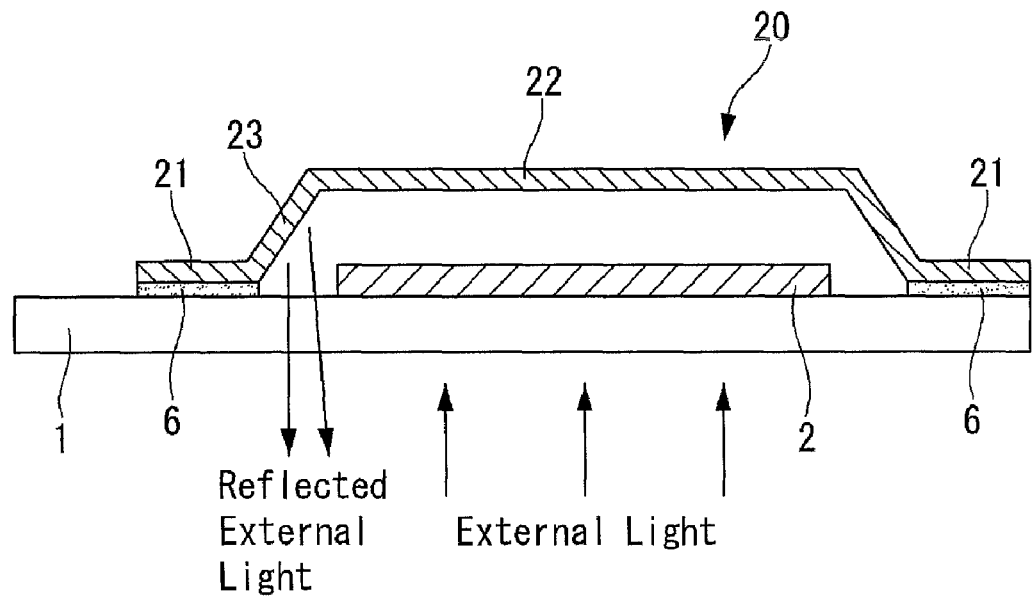
FIG. 2 is a cross-sectional view of the organic light-emitting device taken along the line A-A of FIG. 1.
Figure 3:
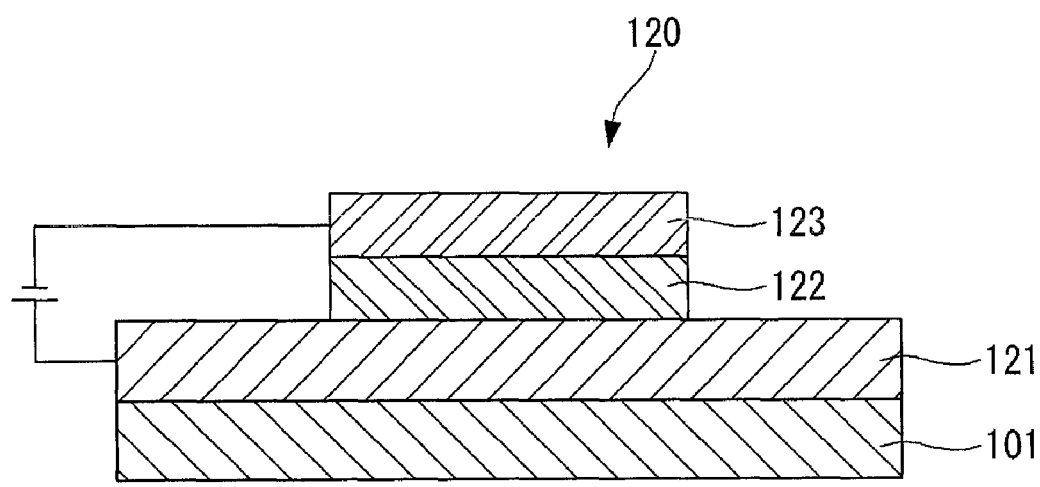
FIG. 3 is a simplified cross-sectional view of an active area disposed in an organic light-emitting device according to a first embodiment of a present invention.
Figure 4:
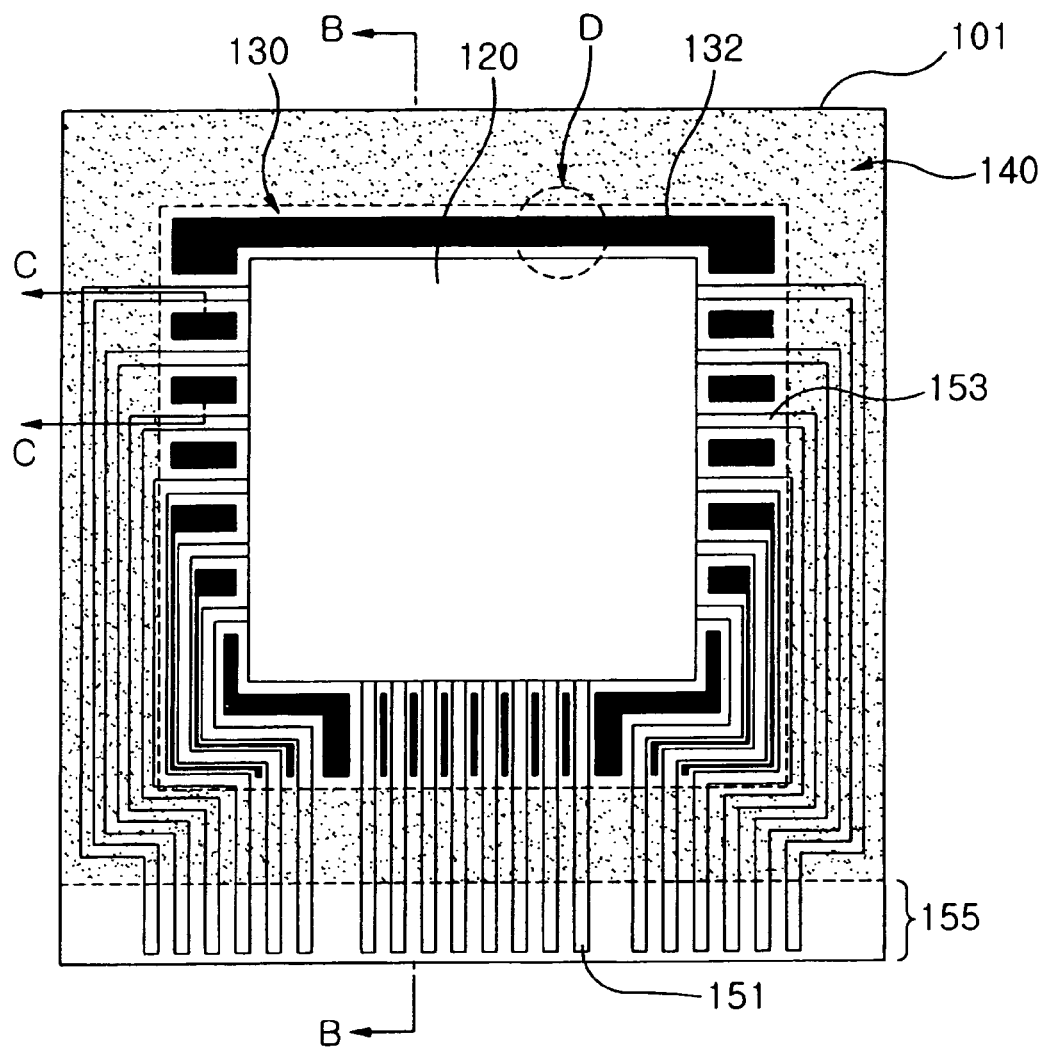
FIG. 4 is a plane view of the organic light-emitting device according to the first embodiment of the present invention.
Figure 5:
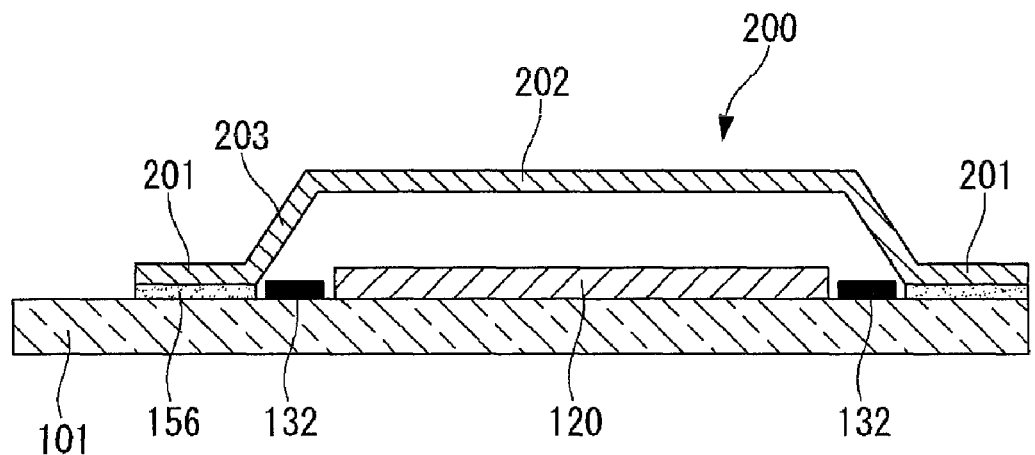
FIG. 5 is a cross-sectional view of the organic light-emitting device according to the first embodiment of the present invention, taken along the line B-B of FIG. 4.

FIG. 3 is a simplified cross-sectional view of an active area disposed in an organic light-emitting device according to a first embodiment of the present invention. FIG. 4 is a plane view of the organic light-emitting device according to the first embodiment of the present invention, and shows the organic light-emitting device to which a cap is not attached. FIG. 5 is a cross-sectional view of the organic light-emitting device according to the first embodiment of the present invention, taken along the line B-B of FIG. 4.

As shown in FIG. 3, the active area 120 of the organic light-emitting device comprises an anode electrode 121, an organic light-emitting layer 122 and a cathode electrode 123, stacked in order on a glass substrate 101. The stacking order of the anode electrode 121, the organic light-emitting layer 122 and cathode electrode 123 is reversible. The cap 200 is attached to the substrate 101 in order to isolate the active area 2 from the outside.

The anode electrodes 121 and the cathode electrodes 123 in the active area 120 are extended to the outside of the active area 120, and connected with data lines 151 and scan lines 153 respectively. Ends of the data lines 151 and the scan lines 153 are disposed on at least one edge of the substrate 101, and included in a pad part 155.

The cap 200 is attached to the substrate 101 on which the active area 120, the data lines 151 and the scan lines 153 are disposed, using a sealant 156. A cap-attaching area 140 is defined as an outer region of the active area 120, disposed on the substrate 101, to which the cap 200 is attached.

FIG. 5 shows the cap 200 comprising a first plane part 201 attached to the cap-attaching area 140, a second plane part 202 corresponding to the active area 120, and a connecting part 203 connecting the first plane part 201 with the second plane part 202.

A transmission area 130 is defined as an area disposed on the substrate 101 between the active area 120 and the cap-attaching area 140, and corresponds to the connecting part 203 of the cap 200.

The organic light-emitting device according to the first embodiment of the present invention comprises a patterned layer 132 disposed on the substrate 101 in the transmission area 130. The patterned layer 132 may be made of material which can block light-transmission.

The patterned layers 132 are selectively arranged between the scan lines 153, between the data lines 151, or between the scan line 153 and the data line 151, within the transmission area 130. Here, the patterned layer 132 is arranged to be spaced apart from the scan line 153 and/or the data line 151.

The organic light-emitting device to which the cap is attached, according to the first embodiment of the present invention, blocks an external light traveling to the inside of the organic light-emitting device through the transmission area 130, by the patterned layer 132. Therefore, the external light is prevented from reaching the connecting part 203 of the cap 200.

Also, even if an external light which is transmitted to the inside of the organic light-emitting device through a gap between the patterned layers 132 of the transmission area 130 is reflected on the connecting part 203, the patterned layers 132 prevent the reflected external light from being transmitted to the outside through the transmission area 130.

Figure 6A:
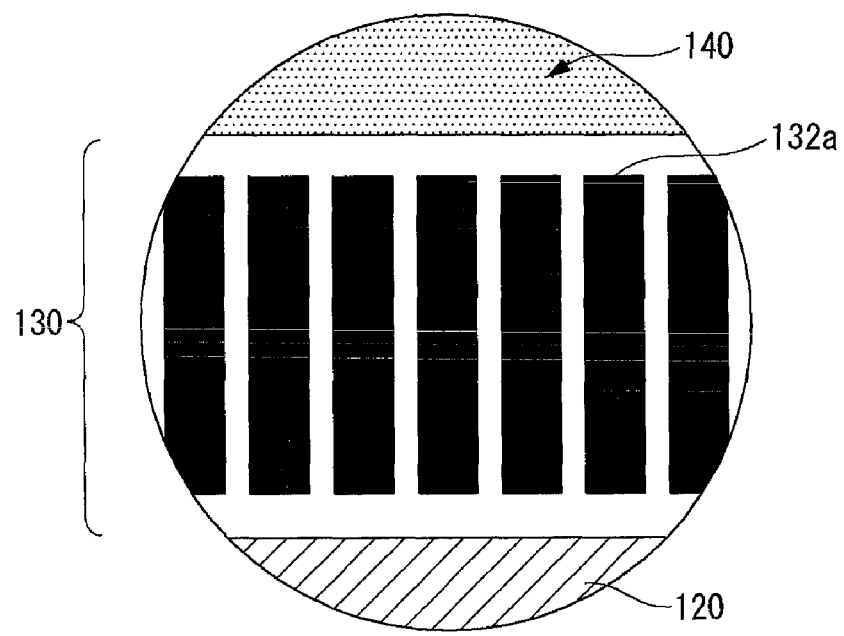
FIGS. 6a and 6b are detailed plane views of "D" section in FIG. 4.
Figure 6B:
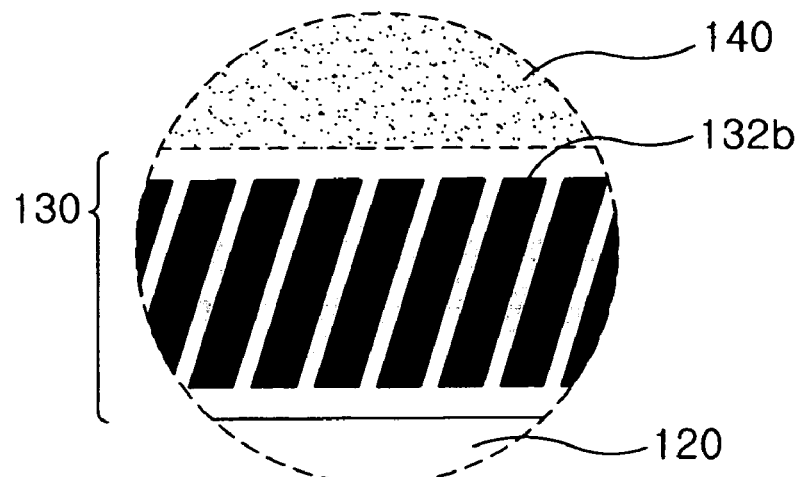

FIGS. 6a and 6b are detailed plane views of "D" section in FIG. 4, and show arrangements of the patterned layers of the organic light-emitting device according to the first embodiment of the present invention.

As shown in FIG. 6a, the patterned layers 132a can be disposed in a direction perpendicular to the cap-attaching area 140. Also, as shown in FIG. 6b, the patterned layers 132b can be aligned with the cap-attaching area 140 at a predetermined angle.

Figure 7:
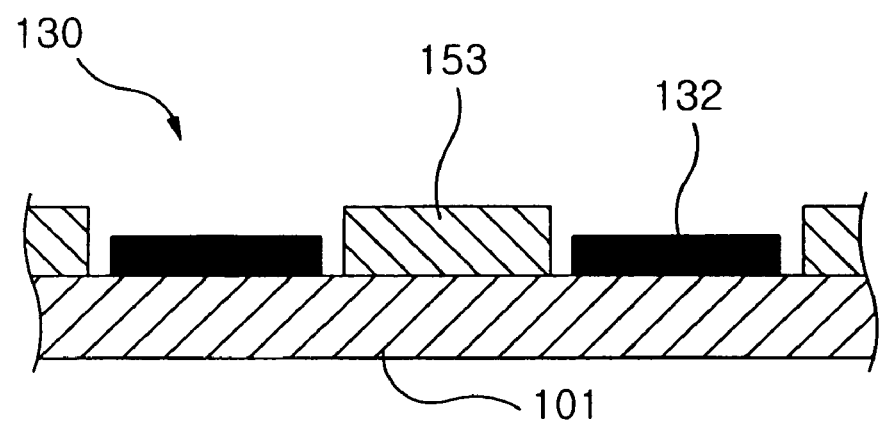
FIG. 7 is a cross-sectional view of the organic light-emitting device according to the first embodiment of the present invention, taken along the line C-C of FIG. 4.

FIG. 7 is a cross-sectional view of the organic light-emitting device according to the first embodiment of the present invention, taken along the line C-C of FIG. 4.

In order to easily form the patterned layer 132 on the substrate 101 made of glass, the patterned layer 132 can be made of metal, for example molybdenum.

Particularly, the patterned layer 132 can be formed together with the anode electrode 121, the cathode electrode 123, the scan line 153, the data line 151, an auxiliary electrode on the scan line 151, or an auxiliary electrode on the data line 151, using the same material, in the same process rather than in an additional process. In this case, the patterned layer 132 can be formed without adding the separate process of forming the patterned layer 132.

In addition, the patterned layer 132 can be made of insulating material. In this case, the organic light-emitting device according to the first embodiment of the present invention does not require a process of precisely forming the patterned layer 132 between the scan lines 153 or between the data lines 151 for preventing the scan lines 153 or the data lines 151 from being shorted.

Figure 8:
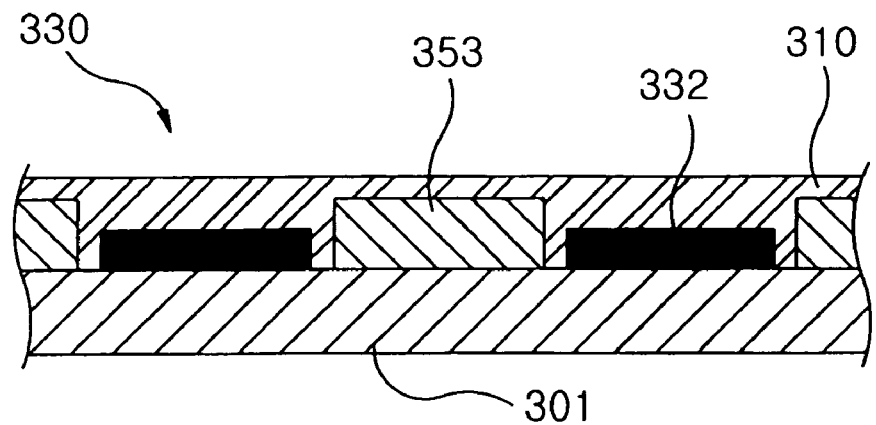
FIG. 8 is a cross-sectional view, corresponding to FIG. 7, of the organic light-emitting device according to a second embodiment of the present invention, taken along the line C-C of FIG. 4.

FIG. 8 is a cross-sectional view, corresponding to FIG. 7, of the organic light-emitting device according to a second embodiment of the present invention, taken along the line C-C of FIG. 4.

In the organic light-emitting device according to the second embodiment of the present invention, patterned layers 332 of a transmission area 330 are selectively disposed between scan lines 353 (or between data lines), and then insulating layers 310 are disposed covering the patterned layers 332 and the scan lines 353 (or the data lines). Therefore, the insulating layer 310 is filled in a space between the scan line 353 and the patterned layer 332 (or between the data line and the patterned layer 332) to prevent the scan lines 353 (or the data lines) from being shorted by the patterned layer 332.

Figure 9:
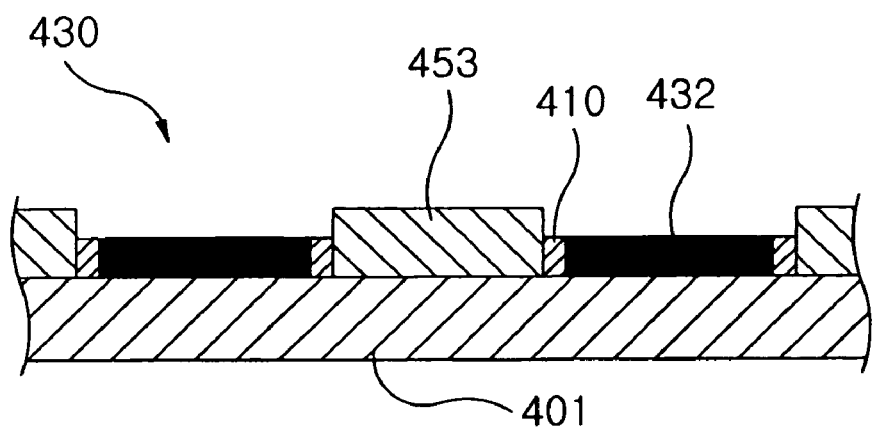
FIG. 9 is a cross-sectional view, corresponding to FIG. 7, of the organic light-emitting device according to a third embodiment of the present invention, taken along the line C-C of FIG. 4.

FIG. 9 is a cross-sectional view, corresponding to FIG. 7, of the organic light-emitting device according to a third embodiment of the present invention, taken along the line C-C of FIG. 4.

In the organic light-emitting device according to the third embodiment of the present invention, patterned layers 432 of a transmission area 430 are selectively disposed between scan lines 453 (or between data lines), and an insulating separator 410 is disposed between the scan line 453 and the patterned layer 432 (or between the data line and the patterned layer 432) to prevent the scan lines 453 (or the data lines) from being shorted by the patterned layer 432.

Figure 10:
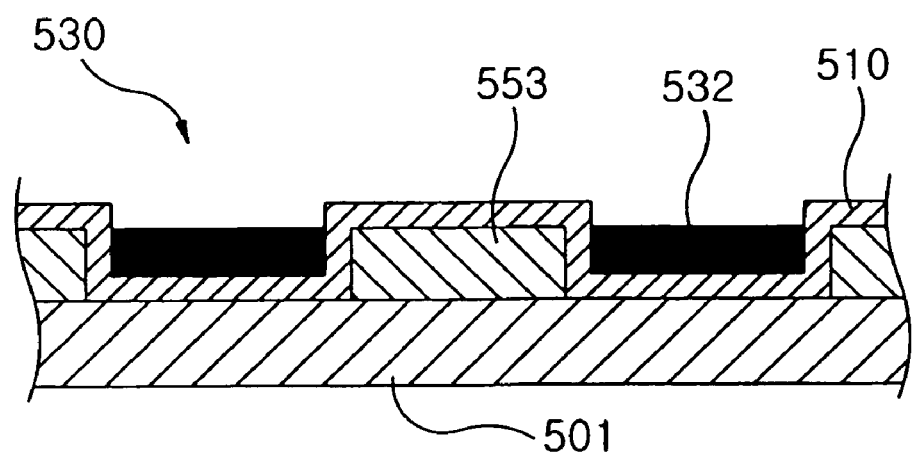
FIG. 10 is a cross-sectional view, corresponding to FIG. 7, of the organic light-emitting device according to a fourth embodiment of the present invention, taken along the line C-C of FIG. 4.

FIG. 10 is a cross-sectional view, corresponding to FIG. 7, of the organic light-emitting device according to a fourth embodiment of the present invention, taken along the line C-C of FIG. 4.

The organic light-emitting device according to the fourth embodiment of the present invention comprises an insulating layer 510 disposed covering a scan line 553 (or a data line) in a transmission area 530; and a patterned layer 532 selectively disposed on the insulating layer 510. Here, the insulating layer 510 can cover only a part of the scan line 553 (the data line).

The organic light-emitting device according to the fourth embodiment of the present invention does not require a process of precisely forming the patterned layer 532 between the scan lines 553 (or between the data lines) for preventing the scan lines 553 (or the data lines) from being shorted.

The present invention can block the external light traveling to the inside of the display device, or the external light reflected on the connecting part of the cap. Therefore, the present invention prevents the reflected external light from undesirably being projected on the substrate.

An embodiment of the present invention may be achieved in a whole or in part by a display device comprising: a substrate; an active area disposed on the substrate; a line electrically connected to the active area, and disposed on the substrate; a cap attached to the substrate to cover the active area; and a patterned layer disposed on a transmission area disposed between the active area and a cap-attaching area to which the cap is attached.

Another embodiment of the present invention may be achieved in a whole or in part by a display device comprising: a substrate; an active area disposed on the substrate; a line electrically connected to the active area, and disposed on the substrate; a cap attached to the substrate to cover the active area; an insulating layer disposed to cover at least a part of a transmission area disposed between the active area and a cap-attaching area to which the cap is attached; and a patterned layer disposed on the insulating layer. Another embodiment of the present invention may be achieved in a whole or in part by a display device comprising: a substrate; an active area disposed on the substrate; a line electrically connected to the active area, and disposed on the substrate; a cap comprising a first plane part attached to the substrate, a second plane part disposed corresponding to the active area in a plane different from a plane of the first plane part, and a connecting part connecting the first plane part with the second plane part; and a patterned layer disposed on a transmission area disposed between the active area and a cap-attaching area to which the cap is attached.

Any reference in this specification to "an embodiment," "another embodiment," "the first embodiment," "the second embodiment," "the third embodiment," or "the fourth embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a substrate;
    an active area disposed on the substrate;
    a line electrically connected to the active area, and disposed on the substrate;
    a cap attached to the substrate to cover the active area; and
    a patterned layer disposed on a transmission area disposed between the active area and a cap-attaching area to which the cap is attached,
    wherein a portion of the line is disposed on the transmission area, and the line and the patterned layer are spaced apart from each other in the transmission area.

2. The display device according to claim 1, wherein the patterned layer is a metal layer.

3. The display device according to claim 2, further comprising an insulating layer disposed on the patterned layer.

4. The display device according to claim 2, further comprising an insulating separator disposed between the patterned layer and the line.

5. The display device according to claim 1, wherein the patterned layer is made of material of the line.

6. The display device according to claim 5, further comprising an insulating layer disposed on the patterned layer.

7. The display device according to claim 5, further comprising an insulating separator disposed between the patterned layer and the line.

8. The display device according to claim 1, wherein the patterned layer is made of insulating material.

9. The display device according to claim 1, wherein the patterned layer comprises a plurality of patterns disposed in a direction perpendicular to the cap-attaching area.

10. The display device according to claim 1, wherein the patterned layer comprises a plurality of patterns aligned with the cap-attaching area at a predetermined angle.

11. The display device according to claim 1, wherein the active area comprises:
    an anode electrode disposed on the substrate;
    an organic light-emitting layer disposed on the anode electrode; and
    a cathode electrode disposed on the organic light-emitting layer.

12. A display device comprising:
    a substrate;
    an active area disposed on the substrate;
    a line electrically connected to the active area, and disposed on the substrate;
    a cap attached to the substrate to cover the active area;
    an insulating layer disposed to cover at least a part of a transmission area disposed between the active area and a cap-attaching area to which the cap is attached; and
    a patterned layer disposed on the insulating layer,
    wherein a portion of the line is disposed on the transmission area, and the line and the patterned layer are spaced apart from each other in the transmission area.

13. The display device according to claim 12, wherein the patterned layer is disposed on an inner region of the cap-attaching area with a predetermined width.

14. The display device according to claim 12, wherein the patterned layer is a metal layer.

15. The display device according to claim 12, wherein the patterned layer comprises a plurality of patterns disposed in a direction perpendicular to the cap-attaching area.

16. The display device according to claim 12, wherein the patterned layer comprises a plurality of patterns aligned with the cap-attaching area at a predetermined angle.

17. The display device according to claim 12, wherein the active area comprises:
    an anode electrode disposed on the substrate;
    an organic light-emitting layer disposed on the anode electrode; and
    a cathode electrode disposed on the organic light-emitting layer.

18. A display device comprising:
    a substrate;
    an active area disposed on the substrate;
    a line electrically connected to the active area, and disposed on the substrate;
    a cap including a first plane part attached to the substrate, a second plane part disposed corresponding to the active area in a plane different from a plane of the first plane part, and a connecting part connecting the first plane part with the second plane part; and
    a patterned layer disposed on a transmission area disposed between the active area and a cap-attaching area to which the cap is attached,
    wherein a portion of the line is disposed on the transmission area, and the line and the patterned layer are spaced apart from each other in the transmission area.

19. The display device according to claim 18, wherein the patterned layer is made of insulating material.

20. The display device according to claim 18, wherein the patterned layer is a metal layer.

21. The display device according to claim 18, wherein the transmission area corresponds to the connecting part.

22. The display device according to claim 21, wherein the patterned layer is made of insulating material.

23. The display device according to claim 22, wherein the patterned layer is a metal layer.

24. The display device according to claim 18, wherein the patterned layer is made of material of the line.

25. The display device according to claim 18, wherein the patterned layer comprises a plurality of patterns disposed in a direction perpendicular to the cap-attaching area.

26. The display device according to claim 18, wherein the patterned layer comprises a plurality of patterns aligned with the cap-attaching area at a predetermined angle.

27. The display device according to claim 18, wherein the active area comprises:

an anode electrode disposed on the substrate;

an organic light-emitting layer disposed on the anode electrode; and a cathode electrode disposed on the organic light-emitting layer.

\* \* \* \* \*